(12) United States Patent
Matsunaga

(10) Patent No.: US 11,431,314 B2
(45) Date of Patent: Aug. 30, 2022

(54) VIBRATOR AND OSCILLATOR

(71) Applicant: SEIKO EPSON CORPORATION, Tokyo (JP)

(72) Inventor: Taku Matsunaga, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/335,337

(22) Filed: Jun. 1, 2021

(65) Prior Publication Data

US 2021/0384884 A1    Dec. 9, 2021

(30) Foreign Application Priority Data

Jun. 3, 2020   (JP) ............................. JP2020-096686

(51) Int. Cl.
| | | |
|---|---|---|
| *H03H 9/02* | (2006.01) | |
| *H03H 9/05* | (2006.01) | |
| *H03B 5/32* | (2006.01) | |
| *H03H 9/10* | (2006.01) | |
| *H03H 9/19* | (2006.01) | |

(52) U.S. Cl.
CPC ........... *H03H 9/02086* (2013.01); *H03B 5/32* (2013.01); *H03H 9/02023* (2013.01); *H03H 9/0509* (2013.01); *H03H 9/0533* (2013.01); *H03H 9/1021* (2013.01); *H03H 9/19* (2013.01)

(58) Field of Classification Search
CPC ........... H03H 9/02086; H03H 9/02023; H03H 9/0509; H03H 9/0533; H03H 9/1021; H03H 9/19; H03B 5/32
See application file for complete search history.

(56) References Cited

U.S. PATENT DOCUMENTS

2015/0349744 A1*  12/2015  Sasaoka ............... H03H 9/1021
                                                                    310/344
2018/0123559 A1*   5/2018  Watanabe ................ H03H 3/02

FOREIGN PATENT DOCUMENTS

| JP | 2000-332572 | 11/2000 |
| JP | 2003-332877 | 11/2003 |
| JP | 2015-053355 | 3/2015 |
| JP | 2019-153855 | 9/2019 |

* cited by examiner

*Primary Examiner* — Jeffrey M Shin
(74) *Attorney, Agent, or Firm* — Rankin, Hill & Clark LLP

(57) ABSTRACT

A vibrator includes a vibration element having an excitation section which is provided with excitation electrodes, and which excites a thickness shear vibration, and a fixation section electrically coupled to at least one of the excitation electrodes, a vibration attenuator disposed on at least one of principal surfaces of the vibration element, and a support substrate having a coupling electrode which is electrically coupled to the fixation section, and which supports the vibration element, wherein the vibration attenuator is disposed at the fixation section side of the excitation electrodes, and at an outer circumferential edge side of the vibration element from the fixation section in a direction perpendicular to a direction in which the excitation electrodes and the fixation section are arranged side by side.

17 Claims, 5 Drawing Sheets

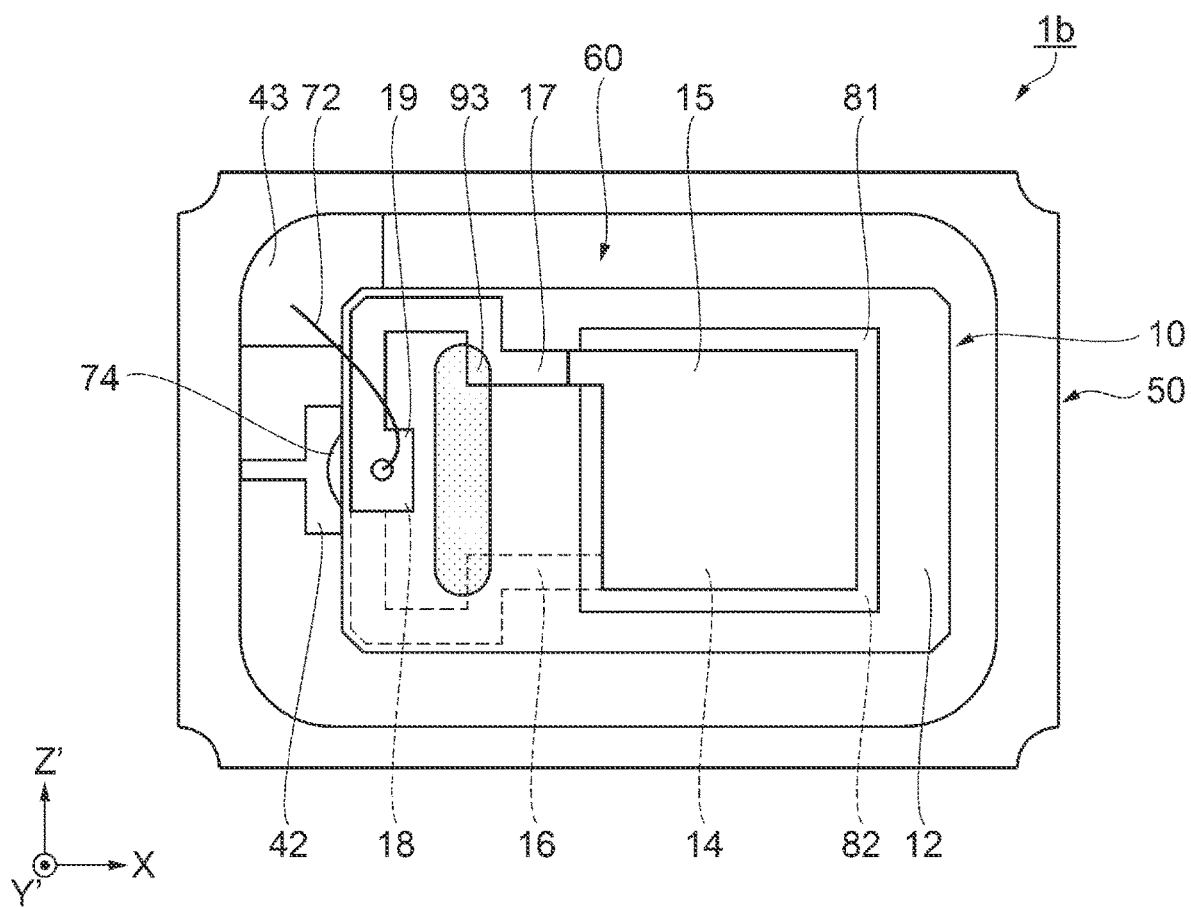

VIBRATOR AND OSCILLATOR

The present application is based on, and claims priority from JP Application Serial Number 2020-096686, filed Jun. 3, 2020, the disclosure of which is hereby incorporated by reference herein in its entirety.

BACKGROUND

1. Technical Field

The present disclosure relates to a vibrator and an oscillator.

2. Related Art

In JP-A-2015-53355 (Document 1), there is described a vibrator device provided with a vibration element as an AT-cut quartz crystal substrate in a package. On each of upper and lower surfaces of the vibration element, there are formed an excitation electrode and an electrode pad, and the excitation electrode and the electrode pad are electrically coupled to each other on each of the surfaces. The package is provided with two electrode terminals, and one of the electrode terminals is electrically coupled to the electrode pad formed on the lower surface of the vibration element, and at the same time, fixes the vibration element in a state of being supported in one place. Further, the other of the electrode terminals is electrically coupled to the electrode pad formed on the upper surface of the vibration element with a bonding wire.

In the configuration described in Document 1, the vibration element is supported by the package at a single point in a central part in the width direction, but is not fixed in the vicinity of the outer circumferential edge of the vibration element such as a corner part of the vibration element. Therefore, there is a problem that the spurious due to a contour vibration caused in the vicinity of the outer circumferential edge increases, and thus, the frequency characteristic deteriorates. Here, the contour vibration means a shear vibration in an in-plane direction of the vibration element which is the spurious having the vibration frequency determined by the dimension of the vibration element, and in which a large amplitude occurs at the outer circumferential edge.

Further, even in the configuration in which two electrode pads are disposed on the lower surface of the vibration element to support the vibration element at two points, when both of the two electrode pads are arranged in the central part in the width direction of the vibration element, substantially the same problem can arise.

SUMMARY

A vibrator includes a vibration element having an excitation section which is provided with excitation electrodes disposed on both principal surfaces, and which excites a thickness shear vibration, and a fixation section electrically coupled to at least one of the excitation electrodes via a wiring section, a vibration attenuator disposed on at least one of the principal surfaces of the vibration element, and a support substrate having a coupling electrode which is electrically coupled to the fixation section via a bonding material, and which supports the vibration element, wherein the vibration attenuator is disposed at the fixation section side of the excitation electrodes, and at an outer circumferential edge side of the vibration element from the fixation section in a direction perpendicular to a direction in which the excitation electrodes and the fixation section are arranged side by side.

An oscillator includes the vibrator described above, an oscillation circuit which is electrically coupled to the excitation electrodes to output an oscillation signal, and a package which is configured to house the vibrator and the oscillation circuit, and which has an external coupling terminal electrically coupled to the oscillation circuit.

BRIEF DESCRIPTION OF THE DRAWINGS

FIG. 3 is a plan view showing an inside of a vibrator according to a third embodiment.

DESCRIPTION OF EXEMPLARY EMBODIMENTS

1. First Embodiment

A vibrator according to a first embodiment will hereinafter be described with reference to the drawings.

Figure 1A:
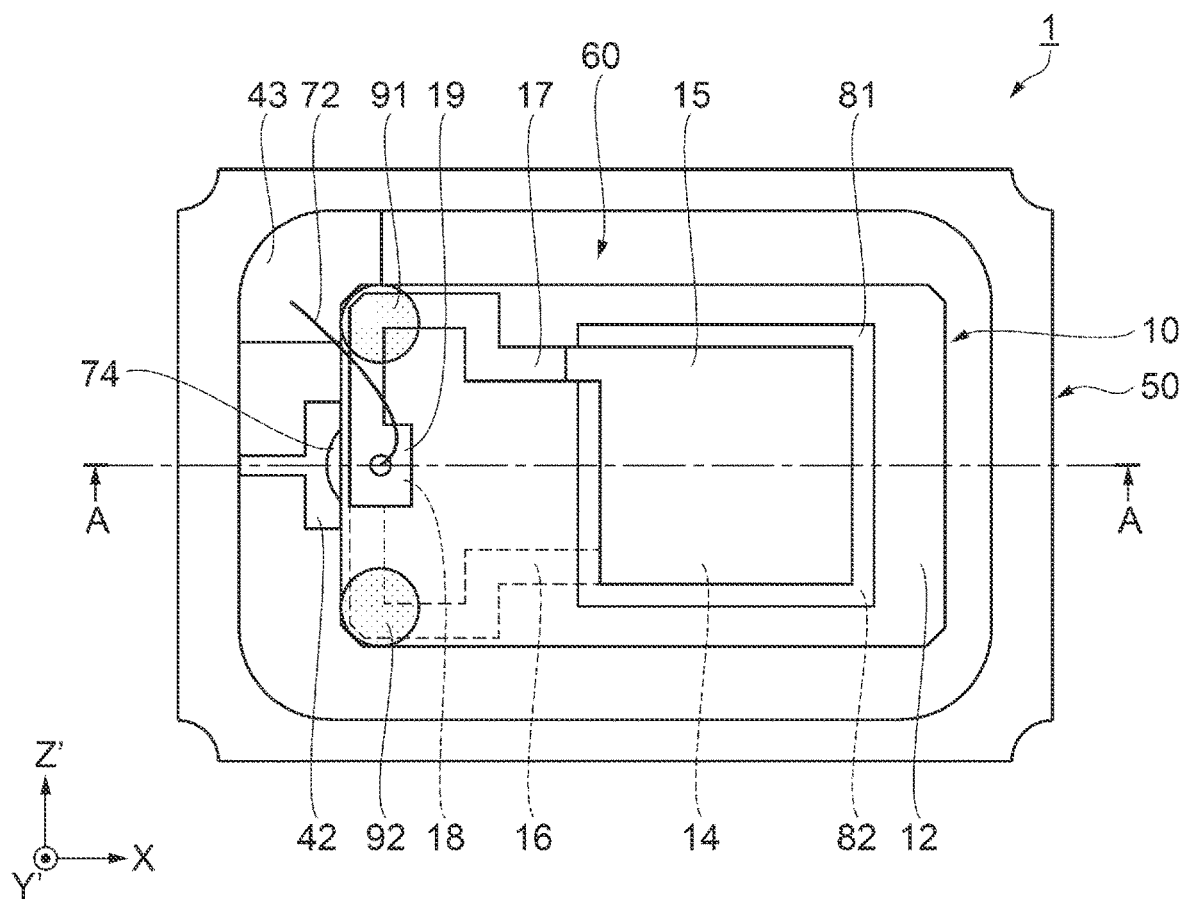
FIG. 1A is a plan view showing an inside of a vibrator according to a first embodiment.
Figure 1B:
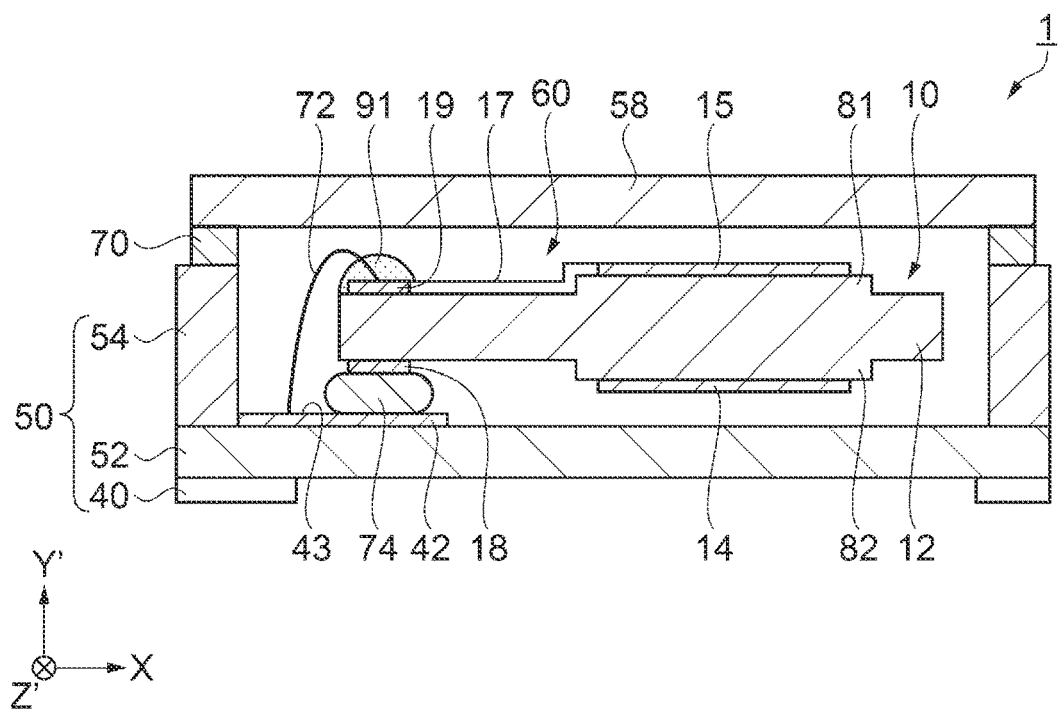
FIG. 1B is a cross-sectional view along the line A-A in FIG. 1A.

FIG. 1A and FIG. 1B are each a schematic configuration diagram of a vibrator 1 according to the first embodiment, wherein FIG. 1A is a plan view showing an inside of the vibrator 1, and FIG. 1B is a cross-sectional view along the line A-A in FIG. 1A. It should be noted that in FIG. 1A, for the sake of convenience of explanation of an internal configuration of the vibrator 1, there is shown a state in which a lid body 58 is removed. Further, in each of the drawings hereinafter described, an X axis, a Y' axis, and a Z' axis which are crystal axes of an element substrate 12 constituting the vibrator 1 are illustrated as three axes perpendicular to each other for the sake of convenience of explanation. Further, for the sake of convenience of explanation, the description will be presented defining a surface at the positive direction side along the Y' axis as an upper surface, and a surface at the negative direction side along the Y' axis as a lower surface.

As shown in FIG. 1A and FIG. 1B, the vibrator 1 according to the first embodiment is configured including a vibration element 10 as a vibration element, a package 50, the lid body 58, and a bonding member 70. The package 50 is a box-like member opening upward, and the vibration element 10 is housed and fixed inside the package 50. To an upper part of the package 50, there is bonded the lid body 58 with the bonding member 70, and thus, the opening of the package 50 is closed.

The vibration element 10 has the element substrate 12 which has a rectangular shape, and has two long sides parallel to the X axis and two short sides parallel to the Z' axis in a plan view. The vibration element 10 is provided with excitation electrodes 14, 15 formed respectively on an upper surface and a lower surface in a central part of the element substrate 12 so as to be opposed to each other, electrode pads 18, 19 formed respectively on the upper surface and the lower surface in an end part of the element substrate 12 so as to be opposed to each other, and lead electrodes 16, 17 as a wiring section formed for electrically coupling the excitation electrodes 14, 15 and the electrode pads 18, 19 to each other, respectively. The excitation electrodes 14, 15 each occupy a large range of the element substrate 12, and the electrode pads 18, 19 are each disposed at substantially the center in the direction along the Z' axis of the element substrate 12, and at the negative side along the X axis of the excitation electrodes 14, 15. In other words, the excitation electrodes 14, 15 and the electrode pads 18, 19 are disposed side by side in a direction along the X axis.

The package 50 is formed by stacking mounting terminals 40, a first substrate 52 as a support substrate, and a second substrate 54 on one another. The mounting terminals 40 are provided to a lower surface of the first substrate 52. Further, at predetermined positions on an upper surface of the first substrate 52, there is disposed a plurality of electrode terminals 42, 43 as coupling electrodes to electrically be coupled to the mounting terminals 40 via through electrodes and inter-layer interconnections not shown. The second substrate 54 disposed on the first substrate 52 is a ring-like body with a central portion removed, and forms a cavity 60 as a space for housing the vibration element 10.

The vibration element 10 housed in the package 50 is fixed to the first substrate 52. Specifically, the electrode pad 18 formed on the lower surface of the element substrate 12 of the vibration element 10 is electrically coupled to the electrode terminal 42 formed on the upper surface of the first substrate 52 via a bonding material 74 such as an electrically-conductive adhesive of a polyimide series. Due to this coupling, the vibration element 10 is fixed to the electrode terminal 42 of the first substrate 52 in a state of being supported in one place. Here, the electrode pad 18 corresponds to a stationary electrode, and functions as a fixation section for fixing the vibration element 10 to the first substrate 52. Further, the electrode pad 19 formed on the upper surface of the element substrate 12 and the electrode terminal 43 formed on the upper surface of the first substrate 52 are electrically coupled to each other with a bonding wire 72 made of metal such as a gold wire or an aluminum wire. By fixing the vibration element 10 with the bonding material 74 in the state of being supported in one place as described above, there is obtained an advantage that it is possible to reduce the stress which is caused by a distortion when the bonding material 74 cures and a distortion due to a difference in linear expansion coefficient from the package 50, and which is applied to the vibration element 10.

The cavity 60 in which the vibration element 10 is housed is closed by bonding the lid body 58 on the second substrate 54 of the package 50 with the bonding member 70. The lid body 58 is a plate-like member formed of, for example, glass, ceramic, or metal, and the bonding member 70 is, for example, an adhesive of a silicone series.

In the cavity 60, a gas of molecules constituted by a combination of carbon, hydrogen, fluorine, and oxygen such as a gas of difluoromethyl ether ($C_2H_4F_2O$), nonafluorobutyl methyl ether ($C_5H_3F_9O$), or nonafluorobutyl ethyl ether ($C_6H_5F_9O$) is airtightly encapsulated together with an inert gas such as nitrogen or argon. In the cavity 60, there is provided a positive pressure atmosphere higher in pressure than the external atmosphere.

By encapsulating the gas of the molecules constituted by the combination of carbon, hydrogen, fluorine, and oxygen in the cavity 60 in which the vibration element 10 is housed, and at the same time, providing the positive pressure atmosphere in the cavity 60, it is possible to fill microscopic gaps generated in the stacking portion between the bonding member 70 or the first substrate 52 and the second substrate 54 with the pressurized gas high in molecule weight. Therefore, it is possible to prevent water vapors from infiltrating from the outside to thereby ensure high airtightness.

Further, regarding outgassing to be generated from the bonding material 74 for fixing the vibration element 10, there is an advantage that the outgassing can be prevented from occurring since the positive pressure atmosphere is provided in the cavity 60.

Further, since the gases such as difluoromethyl ether, nonafluorobutyl methyl ether, and nonafluorobutyl ethyl ether are chemically stable gases free from decomposition by heat, there is an advantage that it is possible to keep the inside of the cavity 60 stable.

It should be noted that the bonding member 70 for bonding the package 50 and the lid body 58 to each other is not limited to the adhesive of the silicone series, and can also be an adhesive of an epoxy series, an acrylic series, a bismaleimide series, or a polyimide series.

Further, as the gas of the molecules constituted by the combination of carbon, hydrogen, fluorine, and oxygen to be enclosed in the cavity 60, there are cited difluoromethyl ether, nonafluorobutyl methyl ether, and nonafluorobutyl ethyl ether, but the gas is not limited to these gases. It should be noted that it is desirable for the gas to be high in molecule weight, free from decomposition by heat and thus chemically stable, and represented by a molecular formula of $$C_nH_mF_{(2n-m+2)}O.$$

The excitation electrodes 14, 15, the lead electrodes 16, 17, and the electrode pads 18, 19 provided to the vibration element 10 are formed by firstly depositing chromium or the like on the element substrate 12, and then stacking gold or the like on the chromium. The electrode film made of chromium or gold is formed to have a desired shape by a method using a metal mask such as a vacuum evaporation method or a sputtering method, or a method of depositing the electrode film on the entire surface of the element substrate 12, and then performing metal etching using a photolithography method. It should be noted that the formation material of the electrode film for enhancing the adhesiveness between the element substrate 12 and the gold electrode film is not limited to chromium, and can also be a nickel-chromium alloy or nickel. Further, the formation material of the electrode film necessary to obtain a stable vibration characteristic and long-term stability is not limited to gold, and can also be platinum or silver.

The element substrate 12 constituting the vibration element 10 is a piezoelectric material such as quartz crystal, and is a rotated Y-cut quartz crystal substrate which has the crystal axes X, Y, and Z perpendicular to each other, and which is carved out along a plane obtained by rotating the X-Z plane including the X axis and the Z axis as much as a predetermined angle θ around the X axis. The element substrate 12 in the present embodiment has the angle θ of about 35° 15', and is called an AT-cut quartz crystal substrate, and has the crystal axes X, Y', and Z' perpendicular to each other. In the AT-cut quartz crystal substrate, the axis in the thickness direction is the Y' axis, the X-Z' plane perpendicular to the Y' axis is the principal surface, and the thickness-shear vibration having a displacement along the X axis is excited as the principal vibration. In other words, in the present embodiment, the upper and lower surfaces of the element substrate 12 are each the principal surface, and an area where the excitation electrodes 14, 15 are each disposed on the principal surface, namely an area where the thickness-shear vibration is excited, corresponds to an excitation section.

Further, in the element substrate 12, mesa structures 81, 82 each having a convex shape are respectively formed in a central part of both of the upper and lower principal surfaces. By adopting this structure, it is possible to more efficiently confine the energy in the excitation section, and thus, it is possible to achieve the high Q-value. It should be noted that the mesa structures 81, 82 are not a limitation, and it is possible to adopt a flat sheet structure or an inverted-mesa structure having a concave shape.

The element substrate 12 in the present embodiment is not limited to the AT-cut quartz crystal substrate having the angle θ of about 35° 15', and can also be a BT-cut quartz crystal substrate having the angle θ of about −49° and is excited in the thickness shear vibration mode, a double rotated quartz crystal substrate which is rotated around the X axis and the Z axis, and is then carved out, namely an SC-cut quartz crystal substrate, or the like.

Further, the first substrate 52 and the second substrate 54 of the package 50 in the present embodiment are each formed of a ceramics material having an insulating property. Such a formation material is not particularly limited, and it is possible to use oxide system ceramics such as alumina, silica, or zirconia, nitride system ceramics such as silicon nitride, aluminum nitride, or titanium nitride, or carbide system ceramics such as silicon carbide. Further, each of the terminals provided to the first substrate 52, electrode interconnections, through electrodes, and so on for electrically coupling the terminals are formed by printing a metal wiring material such as tungsten or molybdenum on the substrate by screen printing, calcining the material, and then performing plating of nickel, gold, or the like on the material.

Further, as the bonding material 74 for bonding the vibration element 10 and the package 50 to each other, there is used the polyimide series adhesive which is low in Young's modulus and has electrical conductivity in order to relax the distortion caused by the difference in linear expansion coefficient between the vibration element 10 and the package 50, but this is not a limitation, and it is also possible to use an electrically-conductive adhesive of the silicone series, the bismaleimide series, or the epoxy series.

Further, taking the bonding nature into consideration, it is possible to adopt a gold bump, a solder bump, or the like higher in Young's modulus compared to the adhesives described above.

As shown in FIG. 1A, on the upper surface of the vibration element 10, namely the principal surface at the upper side of the element substrate 12, in an area at the electrode pads 18, 19 side of the excitation electrodes 14, 15, namely an area at the negative side along the X axis of the excitation electrodes 14, 15, there are disposed vibration attenuation members 91, 92 as a vibration attenuator. Specifically, the vibration attenuation members 91, 92 are each disposed at the outer circumferential edge side of the vibration element 10 from the electrode pads 18, 19 in a direction along the Z' axis perpendicular to a direction along the X axis in which the excitation electrodes 14, 15 and the electrode pads 18, 19 are arranged. The vibration attenuation members 91, 92 are each a member to be applied for suppressing the spurious, and a member lower in elastic modulus than the element substrate 12 such as a silicone series adhesive is used. Here, the vibration attenuation member 91 disposed at the outer circumferential edge side in the positive direction along the Z' axis from the electrode pads 18, 19 corresponds to a first vibration attenuation member, and the vibration attenuation member 92 disposed at the outer circumferential edge side in the negative direction along the Z' axis across the electrode pads 18, 19 from the outer circumferential edge in the positive direction along the Z' axis corresponds to a second vibration attenuation member.

The vibration attenuation members 91, 92 are each disposed so as to cover the outer circumferential edge of the vibration element 10. Specifically, the vibration attenuation member 91 is disposed so as to cover an outer circumferential corner part of an end part at the negative side along the X axis and an end part at the positive side along the Z' axis of the vibration element 10, and the vibration attenuation member 92 is disposed so as to cover an outer circumferential corner part of an end part at the negative side along the X axis and an end part at the negative side along the Z' axis of the vibration element 10. Further, in a plan view viewed from a direction along the Y' axis, the vibration attenuation member 91 overlaps at least a part of the lead electrode 17, and the vibration attenuation member 92 overlaps at least a part of the lead electrode 16.

It should be noted that the positions of the vibration attenuation members 91, 92 are not limited to the positions covering the outer circumferential edge of the vibration element 10, and can be at the inner side of the outer circumferential edge, namely at the electrode pad 18 side, in the direction along the Z' axis, or are not required to overlap the lead electrode 16, 17. Further, the vibration attenuation members 91, 92 are not required to be disposed symmetrically about the X axis, or it is possible to arrange that only either one thereof is disposed. Further, the surface on which the vibration attenuation members 91, 92 are disposed is not limited to the upper surface, and can be the lower surface, or it is possible to dispose the vibration attenuation members 91, 92 on both of the upper and lower surfaces. For example, it is possible to dispose the vibration attenuation member 91 at the positive side along the Z' axis on the upper surface, and dispose the vibration attenuation member 92 at the negative side along the Z' axis on the lower surface so that the vibration attenuation members 91, 92 cover the lead electrodes 16, 17, respectively.

Further, the vibration attenuation members 91, 92 are not limited to the adhesive of the silicone series, and can also be an adhesive of an epoxy series, an acrylic series, a bismaleimide series, or a polyimide series.

The sizes of the vibration attenuation members 91, 92 can relatively freely be set. For example, when the long side of the element substrate 12 is about 1800 μm, a range no smaller than 50 μm and no larger than 300 μm can be adopted.

As described hereinabove, in the present embodiment, the vibration attenuation members 91, 92 are disposed at the outer circumferential edge side in the direction along the Z' axis from the electrode pad 18 for fixing the vibration element 10 to the first substrate 52 on the principal surface of the vibration element 10. By disposing the members lower in elastic modulus than the element substrate 12 as the vibration attenuation members 91, 92, the thermoelastic loss of the spurious increases due to the distortion of the vibration attenuation members 91, 92 themselves, and thus, an effect of suppressing the spurious is exerted. Therefore, the contour vibration generated in the outer circumferential edge portion not fixed to the first substrate 52 of the vibration element 10 is suppressed, and thus, it is possible to realize the frequency characteristic which is low in influence of the spurious and high in accuracy.

Further, according to the present embodiment, since the vibration attenuation members 91, 92 are disposed at the outer circumferential corner parts of the vibration element 10, there is obtained an advantage that it is possible to suppress the returning wave of the spurious on the end surface at the negative side along the X axis of the vibration element 10 in addition to the advantage described above.

Further, according to the present embodiment, the vibration attenuation members 91, 92 are disposed so as to overlap the lead electrodes 16, 17 when viewed from a direction along the Y' axis. This provides an advantage that the vibration leaked from the excitation electrodes 14, 15 to the lead electrodes 16, 17 is suppressed to thereby prevent the vibration from propagating the electrode pad 18 to be leaked to the outside, and thus, the Q-value is improved.

Further, according to the present embodiment, the vibration attenuation members 91, 92 are disposed in both of the end part at the positive side along the Z' axis of the element substrate 12 and the end part at the negative side along the Z' axis thereof, and thus, there can be obtained a higher spurious suppression effect compared to when disposing the vibration attenuation member in either one thereof.

Further, according to the present embodiment, since the element substrate 12 is the AT-cut quartz crystal substrate, it is possible to obtain the vibrator 1 excellent in frequency-temperature characteristic.

2. Second Embodiment

Then, a vibrator according to a second embodiment will be described. It should be noted that the same constituents as in the first embodiment are denoted by the same reference symbols, and the duplicated descriptions will be omitted.

Figure 2:
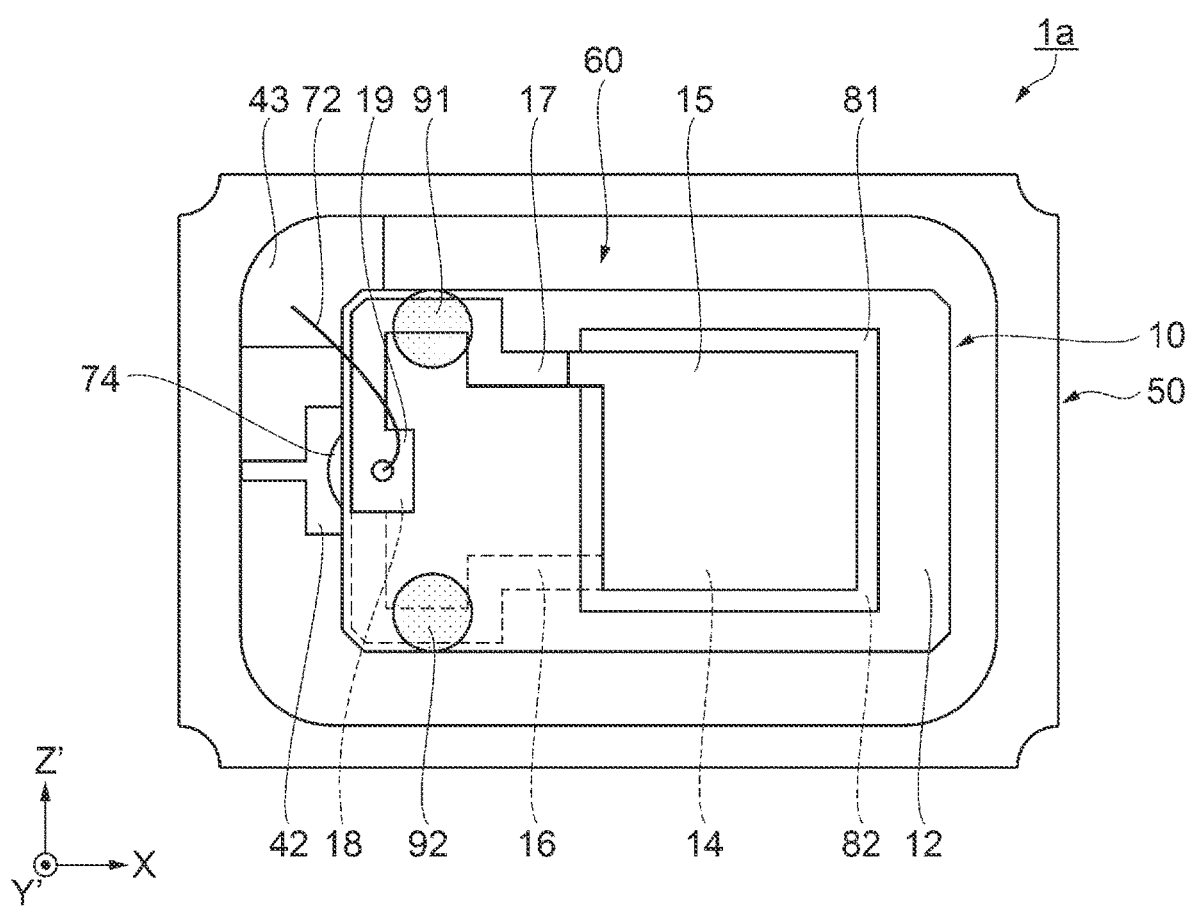
FIG. 2 is a plan view showing an inside of a vibrator according to a second embodiment.

FIG. 2 is a plan view showing an inside of a vibrator 1a according to the second embodiment, and shows the state in which the lid body 58 is removed.

In the present embodiment, unlike the first embodiment, the vibration attenuation members 91, 92 are not disposed in the outer circumferential corner parts of the vibration element 10, but are disposed at positions shifted toward the positive side along the X axis from the end parts at the negative side along the X axis. Further, similarly to the first embodiment, the vibration attenuation members 91, 92 are disposed at the positions respectively covering the outer circumferential edges at both sides in the direction along the Z' axis of the vibration element 10, and at the positions overlapping at least a part of the lead electrodes 16, 17, respectively, in the plan view.

It should be noted that similarly to the first embodiment, the positions of the vibration attenuation members 91, 92 are not limited to the positions covering the outer circumferential edge of the vibration element 10, and can be at the inner side of the outer circumferential edge, namely at the electrode pad 18 side, in the direction along the Z' axis, or are not required to overlap the lead electrode 16, 17. Further, the vibration attenuation members 91, 92 are not required to be disposed symmetrically about the X axis, or it is possible to arrange that only either one thereof is disposed. Further, the surface on which the vibration attenuation members 91, 92 are disposed is not limited to the upper surface, and can be the lower surface, or it is possible to dispose the vibration attenuation members 91, 92 on both of the upper and lower surfaces.

By adopting such a configuration as described above, similarly to the first embodiment, there is obtained the advantage that it is possible to suppress the contour vibration generated in the outer circumferential edge portion not fixed to the first substrate 52 of the vibration element 10, and thus, it is possible to obtain the frequency characteristic which is low in influence of the spurious and high in accuracy.

3. Third Embodiment

Then, a vibrator according to a third embodiment will be described. It should be noted that the same constituents as in the first embodiment are denoted by the same reference symbols, and the duplicated descriptions will be omitted.

FIG. 3 is a plan view showing an inside of a vibrator 1b according to the third embodiment, and shows the state in which the lid body 58 is removed.

In the present embodiment, as the vibration attenuator, a single vibration attenuation member 93 is disposed on the upper surface of the vibration element 10. Specifically, the vibration attenuation member 93 is disposed so as to extend along the Z' axis between the excitation electrode 15 and the electrode pad 19 on the upper surface of the vibration element 10. In other words, the vibration attenuation member 93 has a configuration in which the two vibration attenuation members 91, 92 in the second embodiment are integrated with each other. It should be noted that the vibration attenuation member 93 in the present embodiment does not reach the outer circumferential edges at the both sides in the direction along the Z' axis of the vibration element 10, and falls inside the outer circumferential edges. Further, the vibration attenuation member 93 is disposed at a position overlapping at least a part of both of the lead electrodes 16, 17 in the plan view.

It should be noted that the vibration attenuation member 93 can be disposed so as to cover the outer circumferential edges at the both sides in the direction along the Z' axis of the vibration element 10, or is not necessarily required to overlap the lead electrodes 16, 17. Further, the surface on which the vibration attenuation member 93 is disposed is not limited to the upper surface, and can be the lower surface, or it is possible to dispose the vibration attenuation member 93 on both of the upper and lower surfaces.

According to this configuration, substantially the same advantages as in the first embodiment and the second embodiment can be obtained. Further, since the vibration attenuator is integrated, it is possible to simplify the process of forming the vibration attenuator.

4. Fourth Embodiment

Then, a vibrator according to a fourth embodiment will be described. It should be noted that the same constituents as in the first embodiment are denoted by the same reference symbols, and the duplicated descriptions will be omitted.

Figure 4A:
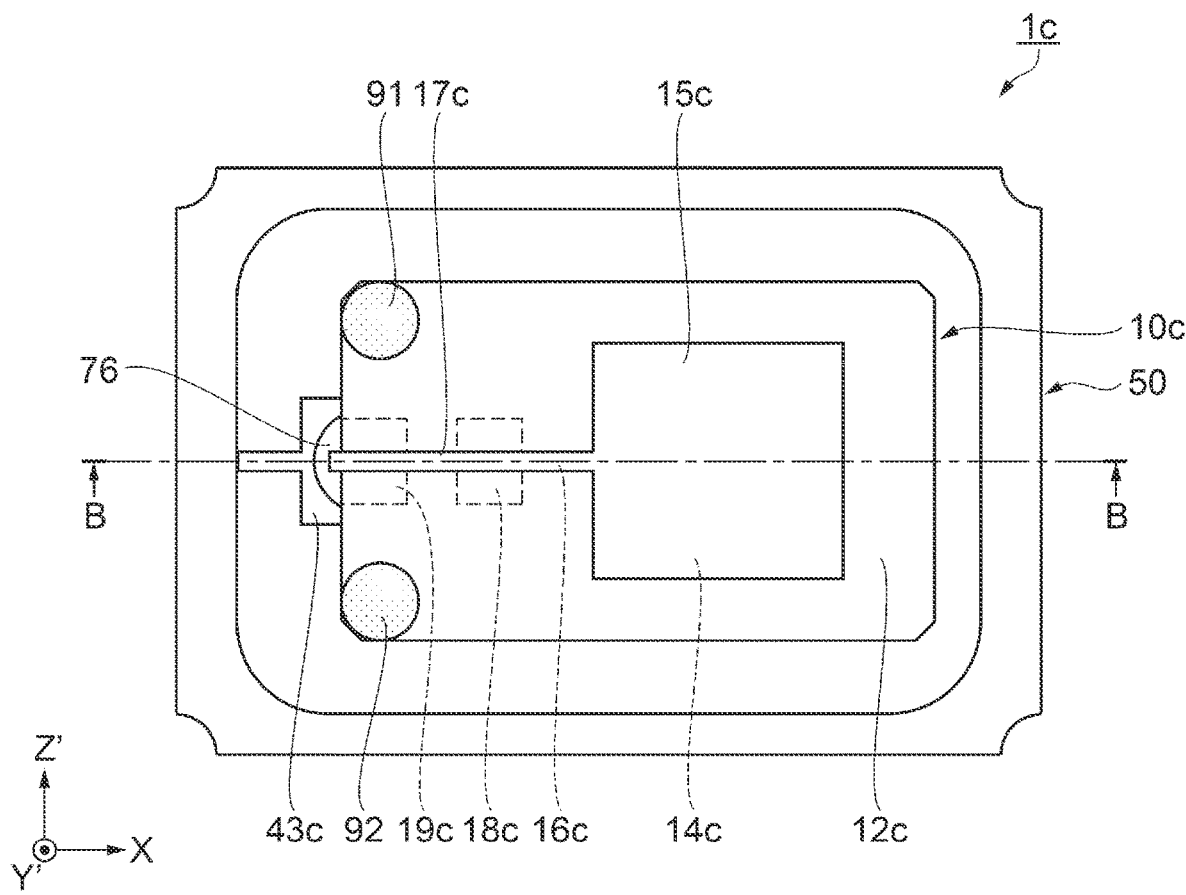
FIG. 4A is a plan view showing an inside of a vibrator according to a fourth embodiment.
Figure 4B:
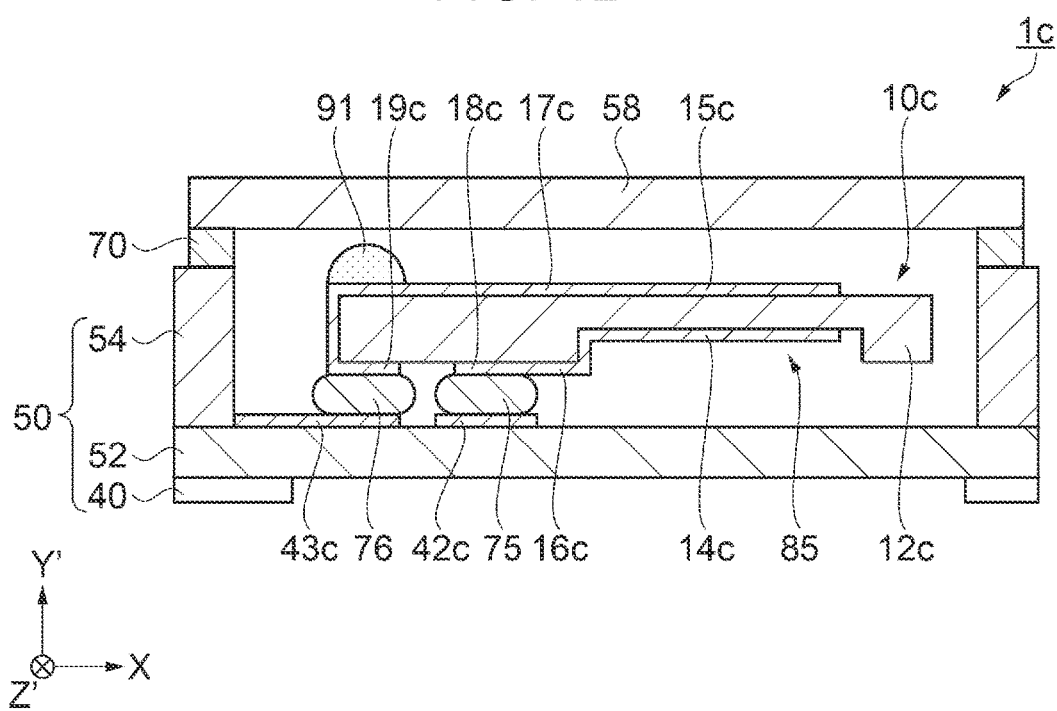
FIG. 4B is a cross-sectional view along the line B-B in FIG. 4A.

FIG. 4A and FIG. 4B are each a schematic configuration diagram of a vibrator 1c according to the fourth embodiment, wherein FIG. 4A is a plan view showing an inside of the vibrator 1c, and FIG. 4B is a cross-sectional view along the line B-B in FIG. 4A. In FIG. 4A, there is shown the state in which the lid 58 is removed.

The vibrator 1c according to the fourth embodiment has a vibration element 10c which is provided with a vibrating area 85 having a concave shape formed in a central portion of the lower surface of an element substrate 12c so as to correspond to a higher frequency. Out of excitation electrodes 14c, 15c provided respectively to the upper and lower surfaces, the excitation electrode 14c at the lower surface side is disposed on a ceiling surface of the vibrating area 85.

In the present embodiment, two electrode pads 18c, 19c provided to the vibration element 10c are arranged side by side in a direction along the X axis in a substantially central part in a direction along the Z' axis on the lower surface of the element substrate 12c. Specifically, the electrode pad 18c is formed at the negative side along the X axis of the excitation electrode 14c on the lower surface, and the electrode pad 19c is formed at the further negative side along the X axis of the electrode pad 18c. A pair of lead electrodes 16c, 17c extend toward the negative direction along the X axis from the excitation electrodes 14c, 15c on the both principal surfaces of the vibration element 10c. The lead electrode 16c at the lower surface side extends in the negative direction along the X axis, and is electrically coupled to the electrode pad 18c. Further, the lead electrode 17c at the upper surface side extends in the negative direction along the X axis, passes the end surface, and is folded back toward the lower surface, and is electrically coupled to the electrode pad 19c.

On the upper surface of the first substrate 52, there are disposed electrode terminals 42c, 43c arranged side by side along the X axis, and the pair of electrode pads 18c, 19c are fixed thereto with bonding materials 75, 76, respectively. In such a manner, the vibration element 10c in the present embodiment is supported at two points by the two electrode pads 18c, 19c arranged along the X axis. In the present embodiment, the two electrode pads 18c, 19c correspond to the stationary electrode, and function as a fixation section for fixing the vibration element 10c to the first substrate 52.

The vibration attenuation members 91, 92 as the vibration attenuator are disposed so as to cover the outer circumferential corner parts of the vibration element 10c similarly to the first embodiment. It should be noted that the arrangement of the vibration attenuator is not limited thereto, and can also adopt the arrangement in, for example, the second embodiment or the third embodiment.

According to this configuration, even in the configuration of supporting the vibration element 10c at the two points, it is possible to suppress the contour vibration generated in the outer circumferential part of the vibration element 10c, and thus, it is possible to obtain the frequency characteristic low in influence of the spurious and high in accuracy.

5. Fifth Embodiment

Then, an oscillator 101 equipped with any one of the vibrators 1, 1a, 1b, and 1c according to the first through fourth embodiments will be described with reference to the drawings.

Figure 5A:
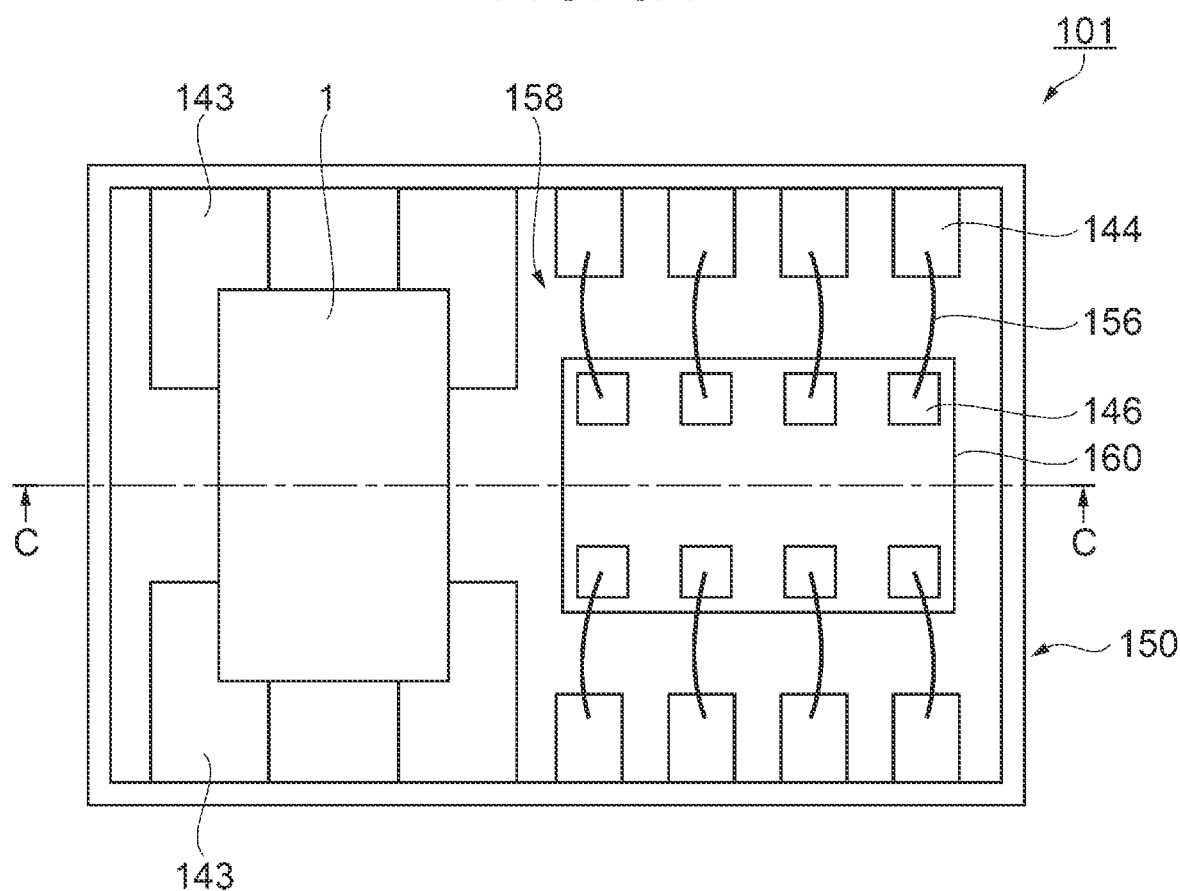
FIG. 5A is a plan view showing an inside of an oscillator according to a fifth embodiment.
Figure 5B:
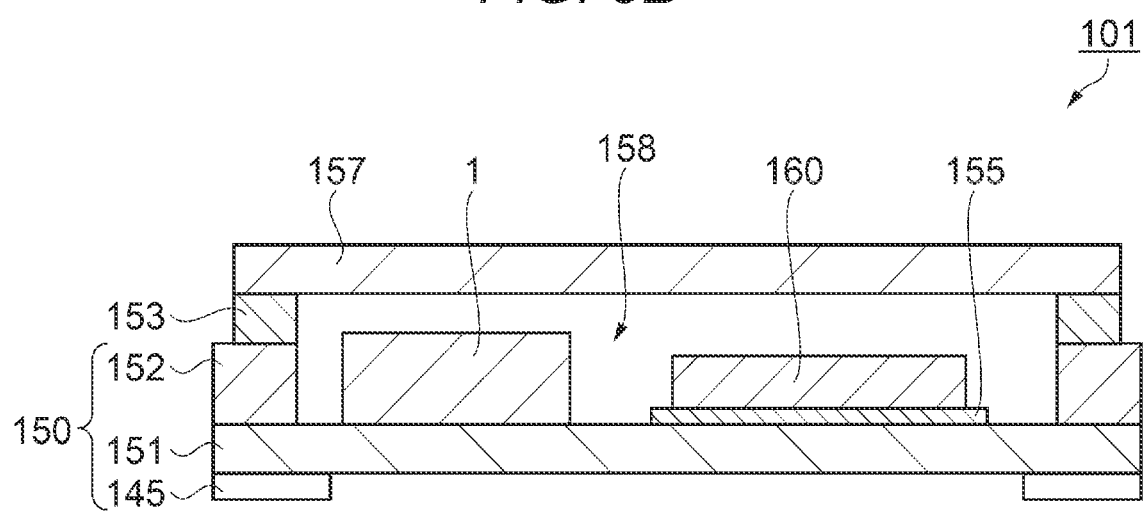
FIG. 5B is a cross-sectional view along the line C-C in FIG. 5A.

FIG. 5A and FIG. 5B are each a schematic configuration diagram of the oscillator 101 according to the fifth embodiment, wherein FIG. 5A is a plan view showing an inside of the oscillator 101, and FIG. 5B is a cross-sectional view along the line C-C in FIG. 5A. It should be noted that in the following description, the description will be presented illustrating a configuration of implementing the vibrator 1 according to the first embodiment. Further, in FIG. 5A, for the sake of convenience of explanation of an internal configuration of the oscillator 101, there is illustrated a state in which a lid body 157 is removed.

As shown in FIG. 5A and FIG. 5B, the oscillator 101 is provided with the vibrator 1, an IC chip 160, a package 150, a seal ring 153, and the lid body 157. The package 150 is a box-like member opening upward, and the vibrator 1 and the IC chip 160 are housed and fixed inside the package 150. To an upper part of the package 150, there is bonded the lid body 157 made of glass, ceramic, metal, or the like with the seal ring 153, and thus, the opening of the package 150 is closed. The IC chip 160 has an oscillation circuit for driving the vibrator 1 to output an oscillation signal.

The package 150 is formed by stacking mounting terminals 145 as external coupling terminals, a third substrate 151, and a fourth substrate 152 on one another. The fourth substrate 152 disposed on the third substrate 151 is a ring-like body with a central portion removed, and forms a cavity 158 as a space for housing the vibrator 1 and the IC chip 160. The third substrate 151 and the fourth substrate 152 are each formed of, for example, ceramic. In the state in which the lid body 157 is bonded to the package 150 with the seal ring 153, the inside of the cavity 158 is airtightly sealed in a reduced pressure atmosphere or an inert gas atmosphere with nitrogen or the like.

In the cavity 158 of the package 150, there are housed the vibrator 1 and the IC chip 160. The vibrator 1 is fixed to coupling terminals 143 disposed on an upper surface of the third substrate 151 via solder or an electrically-conductive adhesive to thereby be electrically coupled thereto. The IC chip 160 is fixed to the upper surface of the third substrate 151 via a bonding material 155 such as an adhesive. Further, on the upper surface of the third substrate 151, there is disposed a plurality of coupling terminals 144 electrically coupled to the coupling terminals 143 via interconnections not shown. The coupling electrodes 144 are each electrically coupled to coupling terminals 146 disposed on an upper surface of the IC chip 160 with bonding wires 156, respectively. Due to the coupling described above, the oscillation circuit provided to the IC chip 160 is electrically coupled to the excitation electrodes 14, 15 of the vibrator 1, and drives the vibrator 1 to output the oscillation signal.

The plurality of mounting terminals 145 is disposed on an exterior bottom surface of the third substrate 151. Further, the mounting terminals 145 are electrically coupled respectively to the coupling terminals 144 disposed on the upper surface of the third substrate 151 via through electrodes or inter-layer interconnections not shown.

The oscillator 101 configured in such a manner is installed in a variety of types of electronic equipment, or a variety of devices such as a vehicle represented by a car, and is coupled to an external circuit via the mounting terminals 145.

According to this configuration, since the vibration attenuator disposed on the principal surface of the vibrator 1 incorporated in the oscillator 101 suppresses the spurious such as the contour vibration, there can be obtained the frequency characteristic low in influence of the spurious and high in accuracy.

What is claimed is:
1. A vibrator comprising:
a vibration element having an excitation section which is provided with excitation electrodes disposed on both principal surfaces, and which excites a thickness shear vibration, and a fixation section electrically coupled to at least one of the excitation electrodes via a wiring section;
a vibration attenuator disposed on at least one of the principal surfaces of the vibration element; and
a support substrate having a coupling electrode which is electrically coupled to the fixation section via a bonding material, and which supports the vibration element, wherein
the vibration attenuator is disposed at the fixation section side of the excitation electrodes, and at an outer circumferential edge side of the vibration element from the fixation section in a direction perpendicular to a direction in which the excitation electrodes and the fixation section are arranged side by side, and the vibration attenuator is disposed so as to cover an outer circumferential corner part of the vibration element.

2. The vibrator according to claim 1, wherein
the vibration element is configured including an AT-cut quartz crystal substrate, and a direction in which the excitation electrode and the fixation section are arranged side by side is parallel to an X axis of the AT-cut quartz crystal substrate.

3. The vibrator according to claim 1, wherein
the fixation section has a single stationary electrode which is electrically coupled to one of the excitation electrodes.

4. The vibrator according to claim 1, wherein
the fixation section has two stationary electrodes which are electrically coupled respectively to the excitation electrodes on the both principal surfaces, and the two stationary electrodes are arranged side by side along a direction in which the excitation electrodes and the fixation section are arranged side by side.

5. An oscillator comprising:
the vibrator according to claim 1;
an oscillation circuit which is electrically coupled to the excitation electrodes to output an oscillation signal; and
a package which is configured to house the vibrator and the oscillation circuit, and which has an external coupling terminal electrically coupled to the oscillation circuit.

6. A vibrator comprising:
a vibration element having an excitation section which is provided with excitation electrodes disposed on both principal surfaces, and which excites a thickness shear vibration, and a fixation section electrically coupled to at least one of the excitation electrodes via a wiring section;
a vibration attenuator disposed on at least one of the principal surfaces of the vibration element; and
a support substrate having a coupling electrode which is electrically coupled to the fixation section via a bonding material, and which supports the vibration element, wherein
the vibration attenuator is disposed at the fixation section side of the excitation electrodes, and at an outer circumferential edge side of the vibration element from the fixation section in a direction perpendicular to a direction in which the excitation electrodes and the fixation section are arranged side by side, and
the vibration attenuator overlaps at least a part of the wiring section in a plan view.

7. The vibrator according to claim 6, wherein
the vibration attenuator is disposed so as to cover the outer circumferential edge of the vibration element.

8. The vibrator according to claim 6, wherein
the vibration element is configured including an AT-cut quartz crystal substrate, and a direction in which the excitation electrode and the fixation section are arranged side by side is parallel to an X axis of the AT-cut quartz crystal substrate.

9. The vibrator according to claim 6, wherein
the fixation section has a single stationary electrode which is electrically coupled to one of the excitation electrodes.

10. The vibrator according to claim 6, wherein
the fixation section has two stationary electrodes which are electrically coupled respectively to the excitation electrodes on the both principal surfaces, and the two stationary electrodes are arranged side by side along a direction in which the excitation electrodes and the fixation section are arranged side by side.

11. An oscillator comprising:
the vibrator according to claim 6;
an oscillation circuit which is electrically coupled to the excitation electrodes to output an oscillation signal; and
a package which is configured to house the vibrator and the oscillation circuit, and which has an external coupling terminal electrically coupled to the oscillation circuit.

12. A vibrator comprising:
a vibration element having an excitation section which is provided with excitation electrodes disposed on both principal surfaces, and which excites a thickness shear vibration, and a fixation section electrically coupled to at least one of the excitation electrodes via a wiring section;
a vibration attenuator disposed on at least one of the principal surfaces of the vibration element; and
a support substrate having a coupling electrode which is electrically coupled to the fixation section via a bonding material, and which supports the vibration element, wherein
the vibration attenuator is disposed at the fixation section side of the excitation electrodes, and at an outer circumferential edge side of the vibration element from the fixation section in a direction perpendicular to a direction in which the excitation electrodes and the fixation section are arranged side by side, and
the vibration attenuator includes a first vibration attenuation member which is disposed at the outer circumferential edge side of the fixation section in a direction perpendicular to the direction in which the excitation electrode and the fixation section area arranged side by side, and a second vibration attenuation member which is disposed at an outer circumferential edge side across the fixation section from the outer circumferential edge.

13. The vibrator according to claim 12, wherein
the first vibration attenuation member and the second vibration attenuation member are integrated with each other.

14. The vibrator according to claim 12, wherein
the vibration element is configured including an AT-cut quartz crystal substrate, and a direction in which the excitation electrode and the fixation section are arranged side by side is parallel to an X axis of the AT-cut quartz crystal substrate.

15. The vibrator according to claim 12, wherein
the fixation section has a single stationary electrode which is electrically coupled to one of the excitation electrodes.

16. The vibrator according to claim 12, wherein
the fixation section has two stationary electrodes which are electrically coupled respectively to the excitation electrodes on the both principal surfaces, and the two stationary electrodes are arranged side by side along a direction in which the excitation electrodes and the fixation section are arranged side by side.

17. An oscillator comprising:
the vibrator according to claim 12;
an oscillation circuit which is electrically coupled to the excitation electrodes to output an oscillation signal; and
a package which is configured to house the vibrator and the oscillation circuit, and which has an external coupling terminal electrically coupled to the oscillation circuit.

* * * * *